(12) United States Patent
Lee et al.

(10) Patent No.: US 6,950,051 B2
(45) Date of Patent: Sep. 27, 2005

(54) ANALOG-DIGITAL CONVERTER WITH PIPELINE FOLDING SCHEME

(75) Inventors: Seung Chul Lee, Daejeon-Shi (KR); Min Hyung Cho, Daejeon-Shi (KR); Mun Yang Park, Daejeon-Shi (KR)

(73) Assignee: Electronics and Telecommunications Research Institute, Daejon-Shi (KR)

(*) Notice: Subject to any disclaimer, the term of this patent is extended or adjusted under 35 U.S.C. 154(b) by 0 days.

(21) Appl. No.: 10/872,530

(22) Filed: Jun. 22, 2004

(65) Prior Publication Data

US 2005/0140535 A1    Jun. 30, 2005

(30) Foreign Application Priority Data

Dec. 26, 2003  (KR) ...................... 10-2003-0097059
Feb. 20, 2004  (KR) ...................... 10-2004-0011197

(51) Int. Cl.$^7$ ............................................. H03M 1/38
(52) U.S. Cl. ...................... 341/161; 341/156
(58) Field of Search ........................ 341/161, 144, 341/155, 118, 143, 156, 120

(56) References Cited

U.S. PATENT DOCUMENTS 6,452,529 B1 * 9/2002 Li ............................. 341/156
6,614,375 B2 * 9/2003 Hochschild ................. 341/143

FOREIGN PATENT DOCUMENTS

KR      2002-72627    9/2002 ........... H03M 1/10

OTHER PUBLICATIONS

Myung-Jun Choe, et al.; "An 8-b 100-MSamaple/s CMOS Pipelined Folding ADC"; IEEE Journal of Solid-State Circuits, vol. 36, No. 2; Feb. 2001; pp. 184-194.
Yun-Ti Wang, et al.; "An 8-bit 150-MHz CMOS A/D Converter"; IEEE Journal of Solid-State Circuits, vol. 35, No. 3; Mar. 2000; pp. 308-317.

* cited by examiner

Primary Examiner—Peguy Jeanpierre
Assistant Examiner—Joseph Lauture
(74) Attorney, Agent, or Firm—Mayer, Brown, Rowe & Maw LLP (57) ABSTRACT

Provided is a pipelined folding analog-digital converter, the pipelined folding analog-digital converter comprising: a first sample-and-hold unit that samples and outputs a number of analog input voltages; a reference voltage generator that generates a number of reference voltages; a pre-amplifier that amplifies and outputs a number of values subtracting each reference voltage from the outputs of the first sample-and-hold unit, wherein an offset effect due to asymmetry of the amplifier is eliminated; a first folder that folds and outputs a number of outputs of the pre-amplifier; a second sample-and-hold unit that samples and outputs a number of outputs of the first folder; a second folder that folds and outputs a number of outputs of the second sample-and-hold unit; and a comparator that performs a comparison operation between the outputs of the pre-amplifier and the output values of the second folder to find a digital output value, whereby the offset caused by the device mismatch is removed, so that it is possible to realize a high-resolution analog-digital converter.

17 Claims, 7 Drawing Sheets

ANALOG-DIGITAL CONVERTER WITH PIPELINE FOLDING SCHEME

BACKGROUND

1. Field of the Invention

The present invention relates to an analog-digital converter. More specifically, the present invention relates to a pipelined folding analog-digital converter.

2. Discussion of Related Art

The conventional analog-digital converter is composed of a first quantizer that quantizes an analog voltage, a residue circuit that outputs a value subtracting an output of the first quantizer from the analog voltage, and a second quantizer that quantizes an output of the residue circuit. The first quantizer can be called a coarse quantizer, and the second quantizer can be called a fine quantizer. A folding analog-digital converter replaces the residue circuit of the conventional analog-digital converter with a folder, thereby improving performance, especially speed, of the analog-digital converter. A pipelined folding analog-digital converter introduces a pipeline scheme into the analog-digital converter having a number of folders, thereby improving the performance of the folding analog-digital converter. A pipeline folding scheme was disclosed on February, 2002 by Myung-Jun Choe in 'IEEE JOURNAL OF SOLID-STATE CIRCUITS, VOL. 36, NO. 2' entitled to 'An 8-b 100-MSample/s CMOS Pipelined Folding ADC'

Figure 1:
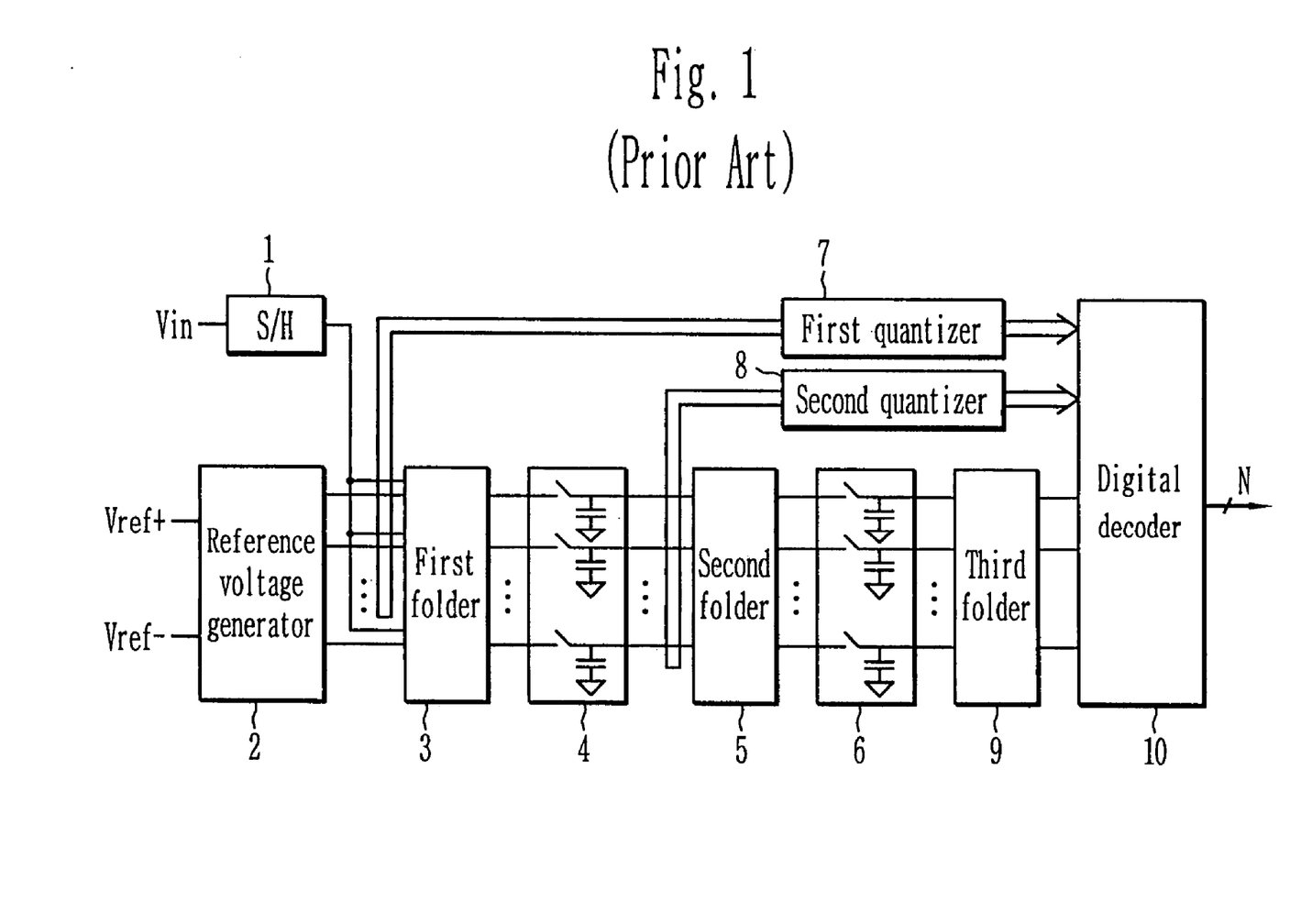
FIG. 1 is a pipelined folding analog-digital converter according to the prior art.

FIG. 1 is a pipelined folding analog-digital converter according to the prior art. The pipelined folding analog-digital converter according to the prior art comprises a sample-and-hold unit 1, a reference voltage generator 2, a first folder 3, a first track-and-hold unit 4, a second folder 5, a second track-and-hold unit 6, first and second quantizers 7 and 8, a third folder 9 and a digital decoder 10.

The pipelined folding analog-digital converter according to the prior art processes a difference between an analog input voltage Vin and a reference voltage by amplifying it through the first and second folders 3 and 5, so that there exists a problem that resolution that can be implemented is limited due to mismatch of devices within the first and second folders 3 and 5. Further, to apply the pipeline scheme, it has the first and second track-and-holder units 4 and 6 between each stage. That is, it is a structure connecting a switch and a capacitor, which exist between each stage, in a parallel. Therefore, it should be designed such that the previous stage and the next stage have the same signal level, and when the signal level is not identical, signal linearity can be degraded. Further, there is a problem that it is difficult to decode lower bits when configuring multiple stages with a folder that has an odd number of folding factors.

SUMMARY OF THE INVENTION

The present invention is contrived to address the problems described above, and is directed to provide a high-speed and high-resolution pipelined folding analog-digital converter.

To overcome the foregoing problems, one aspect of the present invention provides an analog-digital converter comprising a first sample-and-hold unit that samples and outputs a number of analog input voltages; a reference voltage generator that generates a number of reference voltages; a pre-amplifier that amplifies and outputs a number of values subtracting each reference voltage from the outputs of the first sample-and-hold unit, and that eliminates an offset effect due to the asymmetry of the amplifier; a first folder that folds and outputs a number of outputs of the pre-amplifier; a second sample-and-hold unit that samples and outputs a number of outputs of the first folder; a second holder that folds and outputs a number of outputs of the second sample-and-hold unit; and a comparator that performs a comparison operation between the outputs of the pre-amplifier and the output values of the second folder to find a digital output value.

DETAILED DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

Figure 2:
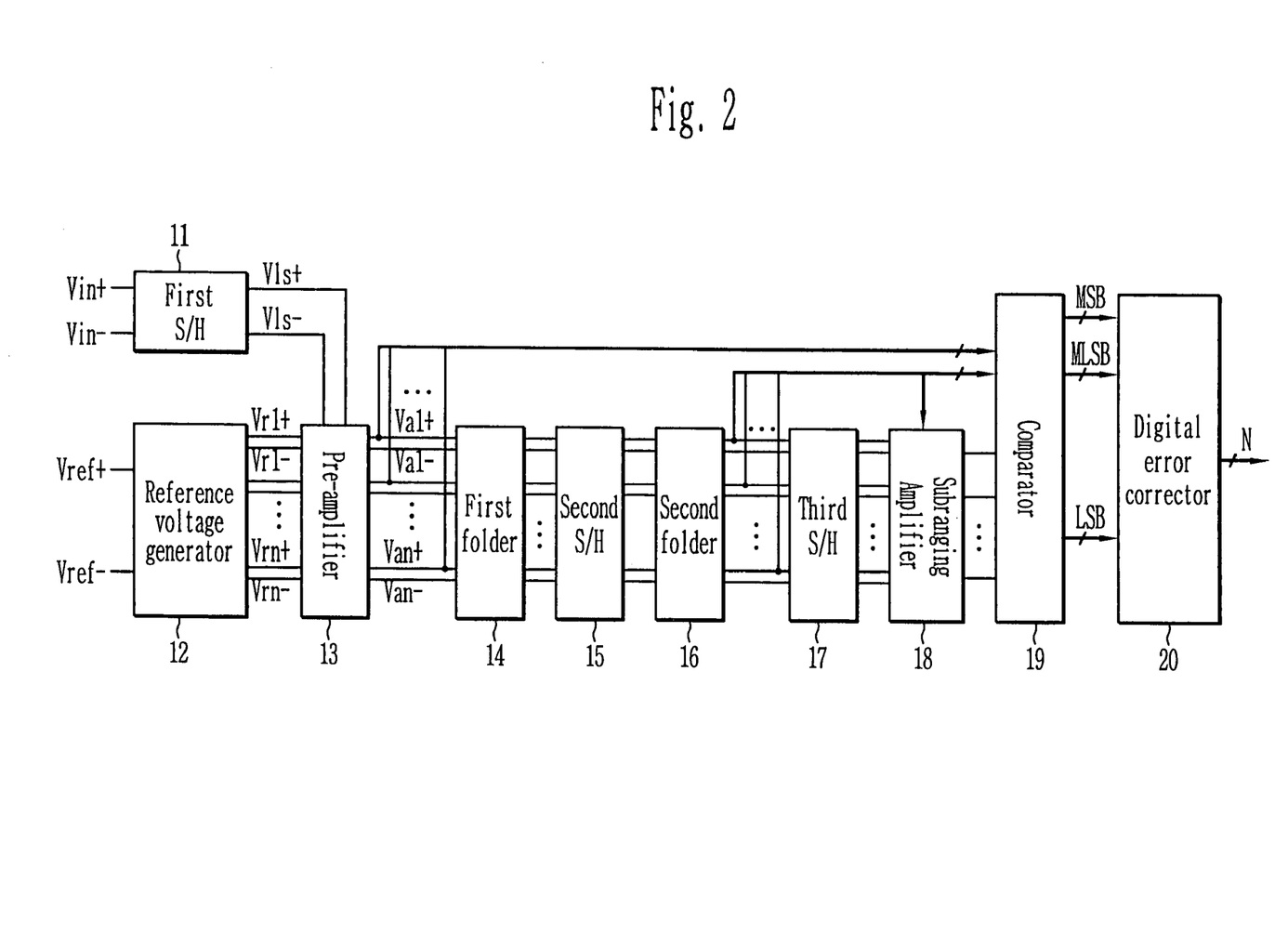
FIG. 2 is a pipelined folding analog-digital converter according to an embodiment of the present invention.

FIG. 2 is a block diagram of a pipelined folding analog-digital converter according to an embodiment of the present invention. In FIG. 2, the analog-digital converter comprises a first sample-and-hold unit 11, a reference voltage generator 12, a pre-amplifier 13, a first folder 14, a second sample-and-hold unit 15, a second folder 16, a third sample-and-hold unit 17, a subranging amplifier 18, a comparator 19 and a digital error corrector 20.

The first sample-and-hold unit 11 samples and outputs differential analog input voltages Vin+, Vin−. The reference voltage generator 12 performs interpolation for input reference voltages Vref+ and Vref− to generate differential reference voltages Vr1+, Vr1−, Vr2+, Vr2−, ... Vrn+ and Vrn−. The pre-amplifier 13 amplifies and outputs values that subtract each differential reference voltages Vrk+ and Vrk−, where k is natural number equal to or less than n, from the sampled differential analog input voltages V1s+ and V1s−. The first folder 14 and the second folder 16 fold and output a number of outputs of the pre-amplifier 13 and a number of outputs of the second sample-and-hold unit 15, respectively. The second sample-and-hold unit 15 and the third sample-and-hold unit 17 sample and output a number of outputs of the first folder 14 and the second folder 16, respectively. The subranging amplifier 18 amplifies and outputs a number of outputs of the third sample-and-hold unit 17. The comparator 19 receives positive outputs Va1+, Va2+, . . . , and Van+ of the pre-amplifier 13 to perform a comparison operation for each input, and outputs a value MSB that sums the number of '1'. Further, after receiving positive outputs of the second folder 16 to perform a comparison operation for each input, it outputs a value MLSB that sums the number of '1'. Further, after receiving positive outputs of the subranging amplifier 18 to perform a comparison operation for each input, it outputs a value LSB that sums the number of '1'. Here, what is meant by "comparison operation" is that when the input value is larger than the threshold value, one of '1' and '0' is outputted, and when the input value is smaller than the threshold value, the remaining one of '1' and '0' is outputted. The digital error corrector 20 receives an output signal of the comparator to check whether or not there exists an error in the digital value, and if there is an error, performs correction of the error.

The analog-digital converter according to an embodiment of the present invention amplifies values subtracting each reference voltage from the sampled differential analog input voltages V1s+ and V1s−, and then passes the values through the comparator 19 to form the upper bits MSB. Twice folded outputs of the pre-amplifier 13 are passed through the comparator 19 to form the intermediate bits MLSB. The outputs of the second folder 16 are amplified and then passed through the comparator 19 to form the lower bits LSB. The digital error corrector 20 receiving the MSB, the MLSB and the LSB corrects an error and outputs the resultant N bit digital signal.

Each stage samples the signals of the previous stage through capacitors connected in series, thereby allowing a pipeline scheme to be applied for a high-speed operation while making each stage isolated with each other in view of a direct current. Therefore, the levels between the output voltages of each stage and the input voltages of the next stage can be designed differently so that flexibility in designing a circuit is enhanced and a lager linear area can be obtained.

The pre-amplifier employed in the analog-digital converter of FIG. 2 will now be described with reference to FIGS. 3 and 4.

Figure 3:
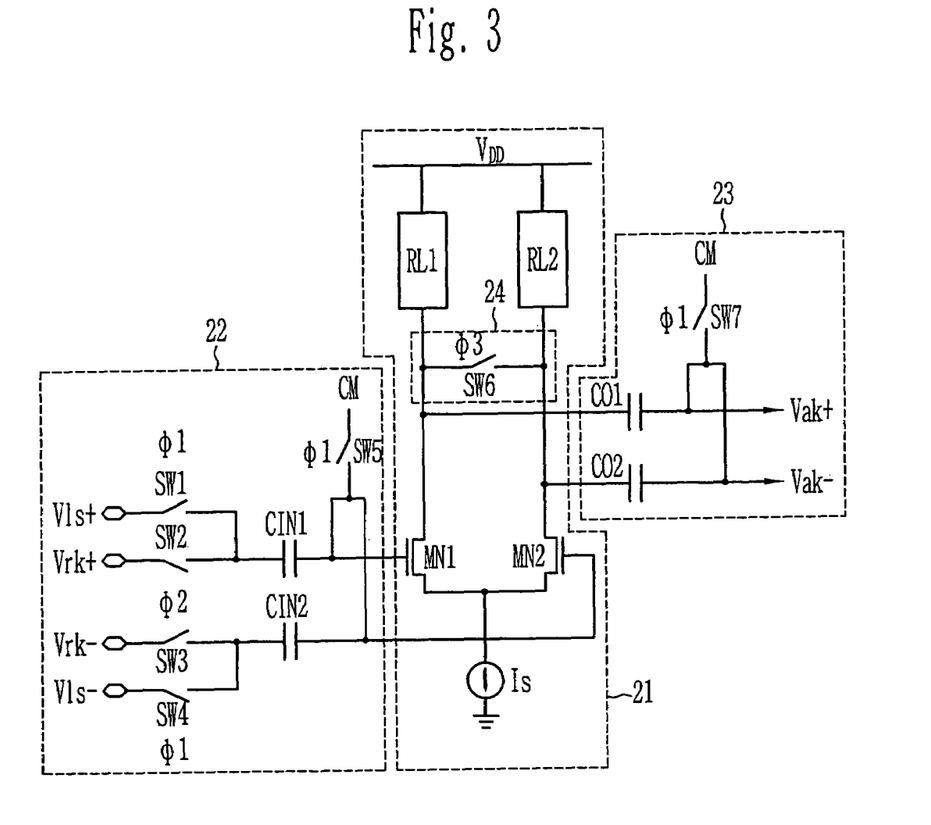
FIG. 3 is a circuit diagram of a pre-amplification circuit included in the pre-amplifier employed in the analog-digital converter of FIG. 2.

FIG. 3 is a circuit diagram of a pre-amplification circuit included in the pre-amplifier employed in the analog-digital converter of FIG. 2. The pre-amplifier 13 includes a number of pre-amplification circuits. In FIG. 3, the pre-amplification circuit comprises an amplifier 21, an input unit 22, an output unit 23 and a reset unit 24.

The amplifier 21 amplifies voltages of differential input stages to output the amplified voltages to differential output stages. The input unit 22 applies a common voltage to the differential input stages of the amplifier 21 during a period when $\phi 1$ signal is '1', and applies a voltage subtraction-operation performed between a sampled positive analog input voltage V1s+ and a positive reference voltage Vrk+, where k is natural number equal to or less than n, and a voltage subtraction-operation performed between a sampled negative analog input voltage V1s− and a negative reference voltage Vrk− to the differential input stages of the amplifier 21 during a period when $\phi 2$ signal is '1'. The output unit 23 stores the offset voltage, caused by the asymmetry of the amplifier 21, during the period when the $\phi 1$ signal is '1', and outputs a value subtracting the offset voltage, stored during the period when $\phi 1$ the signal is '1', from the differential output of the amplifier 21 during the period when the $\phi 2$ signal is '1'. The reset unit 24 interconnects the differential output stages of the amplifier 21 during a period when $\phi 3$ signal is '1'.

From another point of view, the pre-amplification circuit includes an amplifier 21 and four capacitors CIN1, CIN2, CO1 and CO2, and seven switches SW1 to SW7 for eliminating the offset.

The first switch SW1 turns on, when the $\phi 1$ signal is '1', and connects the sampled positive analog input voltage V1s+ to a first terminal of the first capacitor CIN1. The second switch SW2 turns on, when $\phi 2$ signal is '1', and connects the positive reference voltage Vrk+ to a first terminal of the first capacitor CIN1. The third switch SW3 turns on, when the $\phi 2$ signal is '1', and connects the negative reference voltage Vrk− to a first terminal of the second capacitor CIN2. The fourth switch SW4 turns on, when the $\phi 1$ signal is '1', and connects the sampled negative analog input voltage V1s− to a first terminal of the second capacitor CIN2. The second terminals of the first and second capacitors CIN1 and CIN2 are each connected to the differential input stages of the amplifier 21. The fifth switch SW5 turns on, when the $\phi 1$ signal is '1', and connects a common voltage CM to the second terminal of the first capacitor CIN1 and the second terminal of the second capacitor CIN2. The amplifier 21 amplifies and outputs the differential input. The amplifier 21 includes a current source Is, two NMOS transistors MN1 and MN2 and two loads RL1 and RL2. For the first and second transistors MN1 and MN2, gates are each connected to the differential input stages of the amplifier 21, sources are each connected to a first terminal of the current source Is, and drains are each connected to the differential output stages of the amplifier 21. A second terminal of the current source Is is connected to the ground, first terminals of the first and second loads RL1 and RL2 are connected to the power supply voltage VDD, and their second terminals are connected to the differential output stages of the amplifier 21. The sixth switch SW6 turns on, when the $\phi 3$ signal is '1', and interconnects the differential output stages of the amplifier 21. First terminals of the third and fourth capacitors C01 and C02 are each connected to the differential output stages, and their second terminals are connected to the output stages of the pre-amplification circuit. The seventh switch SW7 turns on, when the $\phi 1$ signal is '1', and connects the common voltage CM to the second terminal of the third capacitor CO1 and the second terminal of the fourth capacitor C02.

Figure 4:
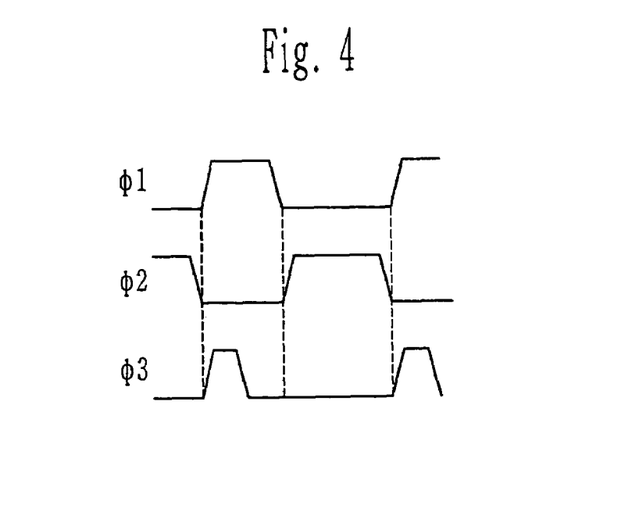
FIG. 4 is a diagram showing waveforms of $\phi 1$, $\phi 2$ and $\phi 3$ signals of FIG. 3.

FIG. 4 shows waveforms of the $\phi 1$, $\phi 2$ and $\phi 3$ signals of FIG. 3. In FIG. 3, the $\phi 1$ and $\phi 2$ signals become '1' alternatively, and there is no period that both signals are '1' at the same time. The $\phi 3$ signal is a signal that temporarily becomes '1' in a front part of a period when the $\phi 1$ is '1', and the remaining period is '0'.

During the period when the $\phi 1$ signal is '1', in the first capacitor CIN1, the first terminal is connected to the sampled positive analog input voltage V1s+, and the second terminal is connected to the common voltage CM. Therefore, the voltage of CM−V1s+ is applied between the second terminal and the first terminal of the first capacitor CIN1. In the same manner, the voltage of CM−V1s− is applied between the second terminal and the first terminal of the second capacitor CIN2. Since all of the differential input stages of the amplifier 21 are connected to the common voltage CM, theoretically, all of the differential output stages of the amplifier 21 should have the same voltage. However, due to the asymmetry between the first and second NMOS transistors NM1 and NM2 and the first and second loads RL1 and RL2, an offset voltage Δ V is generated. For this reason, the voltage of the first terminal of the fourth capacitor CO2 is higher than that of the third capacitor CO1 by the offset voltage Δ V, thus the voltage applied between the second terminal and the first terminal of the fourth capacitor CO2 has a lower voltage by the offset voltage Δ V as compared with a voltage applied between the second terminal and the first terminal of the third capacitor CO1.

During the period when the φ 2 signal is '1', the first terminal of the first capacitor CIN1 is connected to the positive reference voltage Vrk+, and the first terminal of the second capacitor CIN2 is connected to the negative reference voltage Vrk−. For this reason, Vrk+−V1s++CM and Vrk−−V1s−+CM are each applied to the differential input stages of the amplifier 21. Ideally, the amplifier 21 amplifies and outputs a value subtracting one input from the other input of the differential input stages. However, due to the asymmetry as described above, in the first terminal of the fourth capacitor CO2, a voltage is applied higher than the ideal output of the amplifier by the offset voltage Δ V. However, as described above, during the period when the φ 1 is '1', the voltage applied between the first terminal and the second terminal of the fourth capacitor CO2 has a lower voltage by the offset voltage Δ V, so that during the period when the φ 2 signal is '1', a value for which the offset voltage Δ V is cancelled is outputted to the second terminal of the fourth capacitor. Therefore, differential output voltages Vak+ and Vak− of the pre-amplification circuit outputted during the period when the φ 2 signal is '1' are not affected by the offset voltage Δ V.

During a period when the φ 3 signal is '1', the sixth switch SW6 becomes '1', serving to reset the output stages of the amplifier 21 rapidly.

The pre-amplification circuit effectively cancels the offset generated at the pre-amplification circuit itself, so that the amplification ratio of the pre-amplification circuit is increased, thereby optimizing the effect of the offset generated at the subsequent folder.

A first folder employed in the analog-digital converter of FIG. 2 will now be described with reference to FIGS. 5 and 6.

Figure 5:
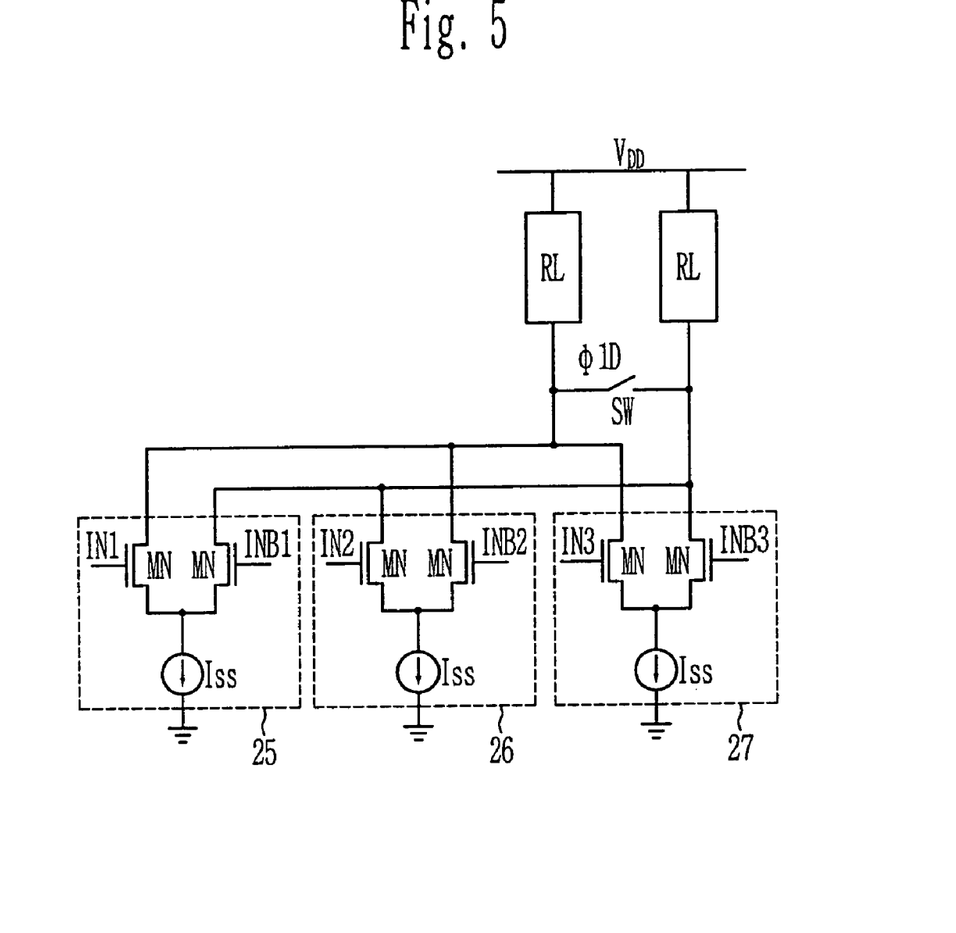
FIG. 5 is a circuit diagram of a folding circuit included in the first folder employed in the analog-digital converter of FIG. 2.

FIG. 5 is a circuit diagram of a folding circuit included in the first folder used for the analog-digital converter of FIG. 2. The first folder 14 includes a number of folding circuits.

In FIG. 5, the folding circuit has three differential inputs, that is, the folding factor is 3. Generally, the folding circuit has an odd number of differential inputs. The folding circuit has three current switches 25, 26 and 27, two loads RL and one switch SW. Each current switch 25, 26 or 27 has two NMOS transistors MN and one current source Iss, for converting and outputting the differential input voltage into the differential current. The output stages of the current switches 25, 26 and 27 are connected to the differential output stages of the folding circuit, alternatively. That is, for the first current switch 25, a positive output is connected to a positive output stage of the folding circuit and a negative output is connected to a negative output stage of the folding circuit, while for the second current switch 26, a positive output is connected to a negative output stage of the folding circuit and a negative output is connected to a positive output stage of the folding circuit, and for the third current switch 27, a positive output is connected to a positive output stage of the folding circuit and a negative output is connected to a negative output stage of the folding circuit.

Figure 6:
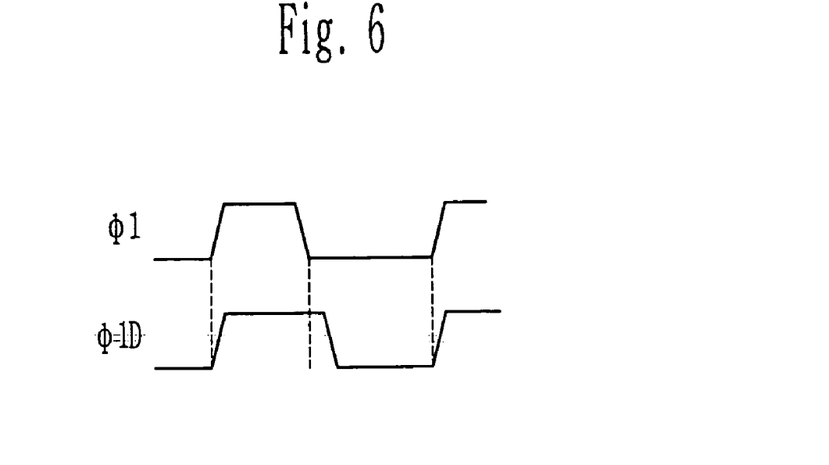
FIG. 6 is a diagram showing a waveform of $\phi 1D$ signal of FIG. 5 together with a waveform of $\phi 1$ signal.

FIG. 6 is a diagram showing a waveform of the φ 1D signal of FIG. 5 together with a waveform of the φ 1 signal. FIG. 6 shows that the φ 1D signal has a period of '1' longer than that of φ 1 signal.

While resetting an output signal of the folding circuit during a period when the φ 1D signal is '1', an output signal of the pre-amplifier is folded and outputted during a period when the φ 2 is '1'. The reset time of the folder is set to be slightly longer than the period when the φ 1 signal is '1', thereby avoiding backward flows due to the previous signal stored in the next stage during the period when the φ 2 signal is '1', and facilitating the output signal to be fixed more rapidly.

The second sample-and-hold unit employed in the analog-digital converter of FIG. 2 will now be described with reference to FIG. 7.

Figure 7:
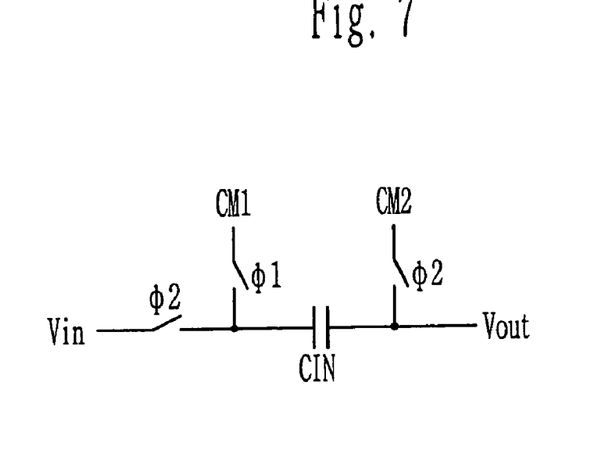
FIG. 7 is a circuit diagram of a sample-and-hold circuit included in the second sample-and-hold unit employed in the analog-digital converter of FIG. 2.

FIG. 7 is a circuit diagram of a sample-and-hold circuit included in the second sample-and-hold unit employed in the analog-digital converter of FIG. 2. The second sample-and-hold unit 15 includes a number of sample-and-hold circuits. For each sample-and-hold circuit, a voltage subtracting the input voltage Vin from a common voltage CM2, that is, CM2−Vin is applied between the second terminal and the first terminal of the capacitor CIN during the period when the φ 2 signal is '1', and then a first common voltage CM1 is applied to a first terminal of the capacitor CIN during the period when the φ 1 signal is '1', thereby making CM1+CM2−Vin applied to the output stages during the period when the φ 1 signal is 'I'. With this operation, the sample-and-hold circuit samples and outputs the output signals of the first folder 14.

The second folder employed in the analog-digital converter of FIG. 2 will now be described with reference to FIGS. 8 and 9.

Figure 8:
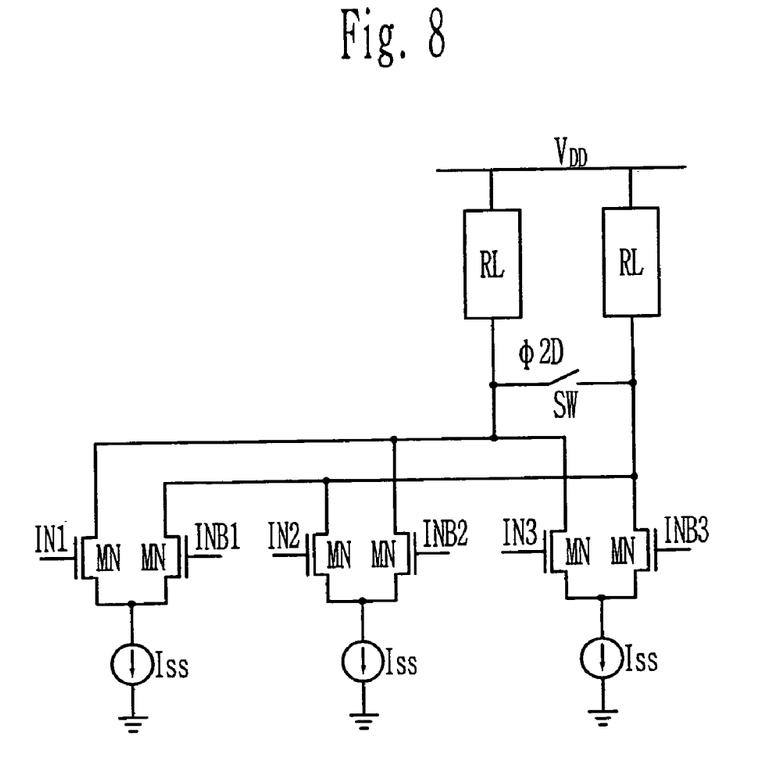
FIG. 8 is a circuit diagram of a folding circuit included in the second folder employed in the analog-digital converter of FIG. 2.
Figure 9:
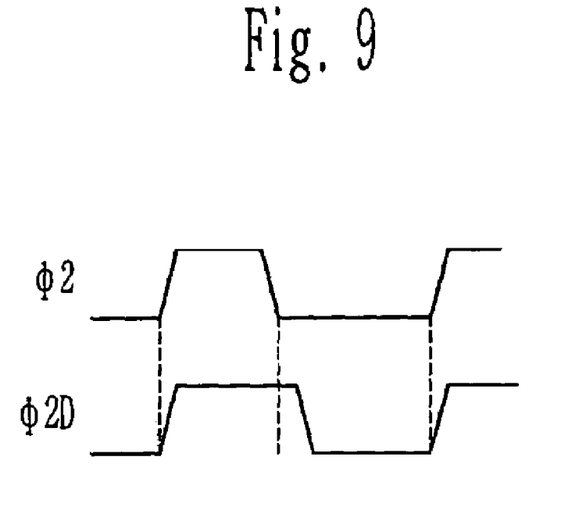
FIG. 9 is a diagram showing a waveform of $\phi 2D$ signal of FIG. 8 together with a waveform of $\phi 2$ signal.

FIG. 8 is a circuit diagram of a second folding circuit included in the second folder employed in the analog-digital converter of FIG. 2. The second folder 16 includes a number of folding circuits. FIG. 9 is a diagram showing a waveform of the φ 2D signal of FIG. 8 together with a waveform of the φ 2 signal. The folding circuit of the second folder 16 has no difference in the configuration compared with the folding circuit of the first folder 14, except for the timing difference. That is, for the folding circuit of the second folder 16, while the output signals of the folding circuit are reset during a period when the φ 2D signal is '1', the output signals of the second sample-and-hold unit 15 are folded and outputted during the period when the φ 1 signal is '1'.

The third sample-and-hold unit employed in the analog-digital converter of FIG. 2 will now be described with reference to FIG. 10.

Figure 10:
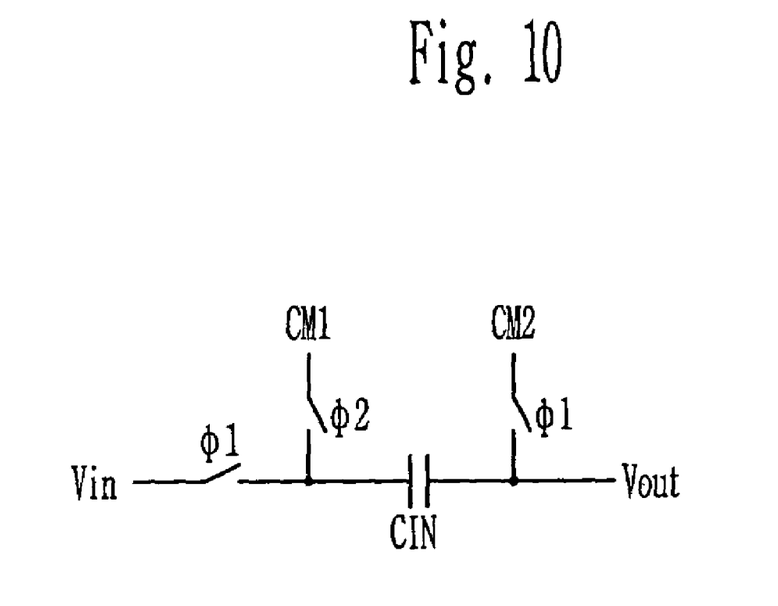
FIG. 10 is a circuit diagram of a sample-and-hold circuit included in the third sample-and-hold unit employed in the analog-digital converter of FIG. 2.

FIG. 10 is a circuit diagram of a sample-and-hold circuit included in the third sample-and-hold unit employed in the analog-digital converter of FIG. 2. The third sample-and-hold unit 17 includes a number of sample-and-hold circuits. For each sample-and-hold circuit, a voltage subtracting the input voltage Vin from the common voltage CM2, that is, CM2−Vin is applied between the second terminal and the first terminal of the capacitor CIN during the period when the φ 1 signal is '1, and then the first common voltage CM1 is applied to the first terminal of the capacitor CIN during the period when the φ 2 signal is '1', thereby making CM1+CM2−Vin applied to the output stages during the period when the φ 2 signal is '1'. With this operation, the sample-and-hold circuit samples and outputs the output signals of the second folder 16.

The subranging amplifier employed in the analog-digital converter of FIG. 2 will now be described with reference to FIG. 11.

Figure 11:
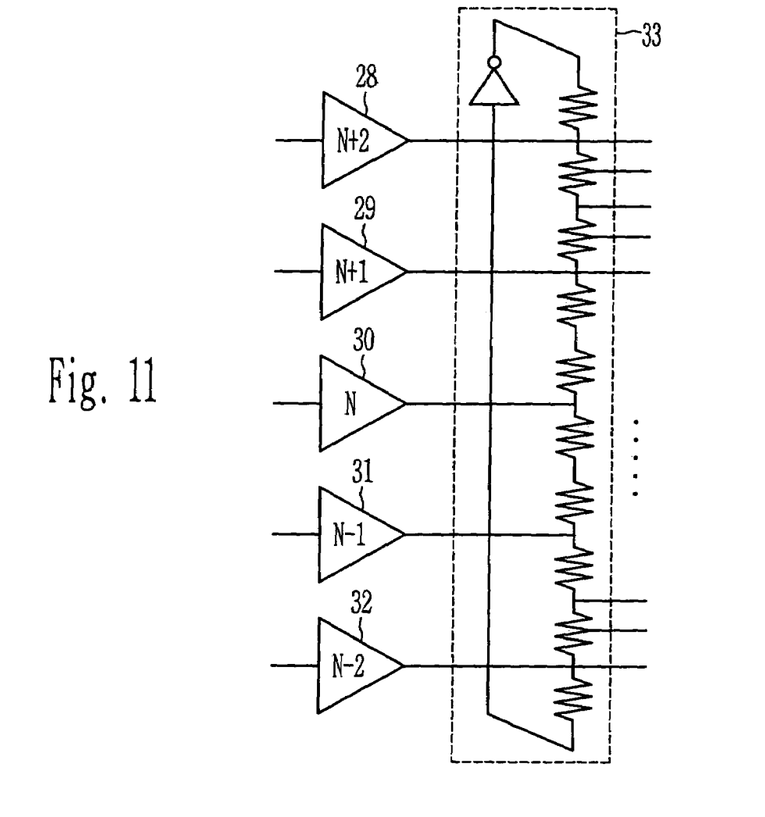
FIG. 11 is a circuit diagram of a subranging amplifier employed in the analog-digital converter of FIG. 2.

FIG. 11 is a circuit diagram of the subranging amplifier employed in the analog-digital converter of FIG. 2. In FIG. 11, the subranging amplifier 18 includes first to fifth amplifiers 28 to 32 and an interpolator 33.

The third amplifier 30 receives an output of the third sample-and-hold unit 17 determined by the output value of the second folder 16. The second and fourth amplifiers 29 and 31 receive the upper level and the lower level of the input of the third amplifier 30, respectively. The first and fifth amplifiers 28 and 32 receive the upper level of the second amplifier 29 and the lower level of the input of the fourth amplifier 31, respectively. The interpolator 33 interpolates and outputs the output voltages of the first to fifth amplifiers 28 to 32 with resistors.

At this time, for the first and fifth amplifies 28 and 32, that is, both ends of the subranging amplifier 18, the resolution can be improved by inverting the output signals of the first and fifth amplifiers 28 and 32 to connect with resistors to have the same output condition with the other second, third, and fourth amplifiers 29, 30 and 31. For the differential configuration, the same effect can be achieved by crossing the differential outputs of two amplifiers.

Figure 12:
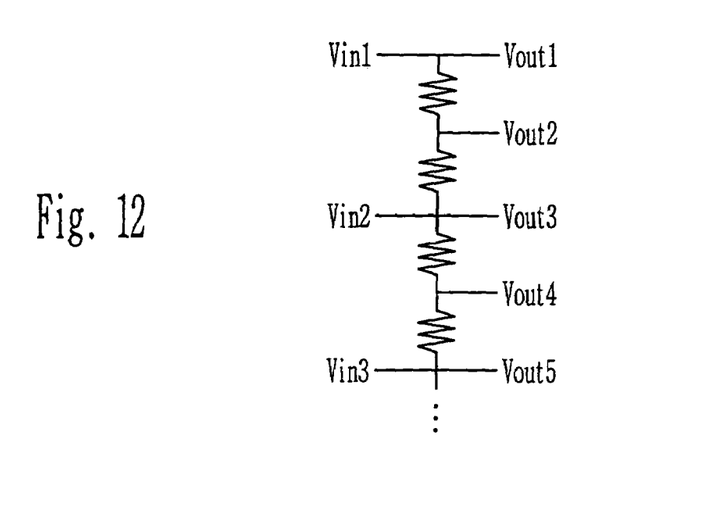
FIG. 12 is a circuit diagram showing an interpolator.

The interpolator, which can be used for the output stages of the pre-amplifier 13, the first folder 14 and the second folder 16 employed in the analog-digital converter of FIG. 2, will now be described with reference to FIG. 12. FIG. 12 is a circuit diagram showing the interpolator. The interpolator, having a number of resistors connect in series, interpolates and outputs the input signals. The interpolator can be used in connection with the output stages of the pre-amplifier 13, the first folder 14 and the second folder 16.

Although the preferred embodiments of the present invention have been described, it should be noted that these embodiments are just illustrative, and not restrictive. Further, those skilled in the art will appreciate that various modifications can be made without departing from the scope of the present invention.

The pipelined folding analog-digital converter according to the present invention eliminates the offset caused by the asymmetry of the amplifier, thereby having a merit that a high-resolution analog-digital converter can be implemented.

Further, for the pipelined folding analog-digital converter according to the present invention, each folder is connected to the sample-and-hold unit, thereby having a merit that it can be applied even when the signal level of each folder is not equal.

Further, the pipelined folding analog-digital converter according to the present invention comprises the subranging amplifier, resulting in a high-resolution.

What is claimed is:

1. An analog-digital converter comprising:
    a first sample-and-hold unit that samples and outputs a number of analog input voltages;
    a reference voltage generator that generates a number of reference voltages;
    a pre-amplifier that amplifies and outputs a number of values subtracting each reference voltage from the outputs of the first sample-and-hold unit, and that eliminates an offset effect due to asymmetry of the amplifier;
    a first folder that folds and outputs a number of outputs of the pre-amplifier;
    a second sample-and-hold unit that samples and outputs a number of outputs of the first folder;
    a second folder that folds and outputs a number of outputs of the second sample-and-hold unit; and
    a comparator that performs a comparison operation between the outputs of the pre-amplifier and the output values of the second folder.

2. The analog-digital converter according to claim 1, wherein the pre-amplifier has a number of pre-amplification circuits, each pre-amplification circuit including:
    an amplifier that amplifies voltages of differential input stages to output the amplified to differential output stages;
    an input unit that, during a first period, applies a common voltage to the differential input stages of the amplifier, and during a second period, applies to the differential input stages of the amplifier a voltage according to subtraction-operation between a sampled positive analog input voltage and a positive reference voltage, as well as a voltage according to subtraction-operation between a sampled negative analog input voltage and a negative reference voltage;
    an output unit that, during the first period, stores an offset voltage caused by asymmetry of the amplifier, and during the second period, outputs a voltage subtracting the offset voltage stored during the first period from the differential output of the amplifier; and
    a reset unit that interconnects the differential output stages of the amplifier during a third period,
    wherein the first and second periods are alternatively repeated without overlapping area and the third period corresponds to a front part of the first period.

3. The analog-digital converter according to claim 1, wherein the preamplifier has a number of the pre-amplification circuits, each pre-amplification circuit including:
    a first capacitor having a first terminal and a second terminal;
    a second capacitor having a first terminal and a second terminal;
    a third capacitor having a first terminal and a second terminal;
    a fourth capacity having a first terminal and a second terminal;
    a first switch that connects a sampled positive analog input voltage to the first terminal of the first capacitor only during a first period;
    a second switch that connects a positive reference voltage to the first terminal of the first capacitor only during a second period;
    a third switch that connects a negative reference voltage to the first terminal of the second capacitor only during the second period;
    a fourth switch that connects a sampled negative analog input voltage to the first terminal of the second capacitor only during the first period;
    a fifth switch that connects a common voltage to the second terminal of the first capacitor and the second terminal of the second capacitor only during the first period;
    an amplifier in which differential input stages are connected to the second terminal of the first capacitor and the second terminal of the second capacitor, and differential output stages are connected to the first terminal of the third capacitor and the first terminal of the fourth capacitor;
    a sixth switch that interconnects the differential output stages of the amplifier only during a third period; and a seventh switch that connects the common voltage to the second terminal of the third capacitor and the second terminal of the fourth capacitor only during the first period, wherein the first period and the second period are alternatively repeated without overlapping area, and the third period corresponds to a front part of the first period.

4. The analog-digital converter according to claim 3, wherein the amplifier includes a first NMOS transistor, a second NMOS transistor, a current source, a first load and a second load;

wherein, in the first NMOS transistor, a gate, a source and a drain are each connected to a positive input stage of the amplifier, a first terminal of the current source and a positive output stage of the amplifier;

wherein, in the second NMOS transistor, a gate, a source and a drain are each connected to a negative input stage of the amplifier, the first terminal of the current source and a negative output stage of the amplifier;

wherein, a second terminal of the current source is connected to the ground;

wherein the first load is connected to the positive output stage of the amplifier and a voltage power supply; and wherein the second load is connected to the negative output stage of the amplifier and the voltage power supply.

5. The analog-digital converter according to claim 1, wherein the first and second folders include a number of folding circuits, each folding circuit having an odd number of current switches that each convert and output an odd number of differential input voltages into an odd number of differential currents, a first load, a second load and a switch, wherein output stages of the odd number of current switches are alternatively connected to the differential output stages of the folding circuit;

wherein the first load is connected to the positive output stage of the folding circuit and a voltage power supply;

wherein the second load is connected to the negative output stage of the folding circuit and the voltage power supply; and wherein the switch is connected to the positive output stage and the negative output stage of the folding circuit.

6. The analog-digital converter according to claim 5, wherein the current switch includes a first NMOS transistor, a second NMOS transistor and a current source, wherein, in the first NMOS transistor, a gate, a source and a drain are each connected to a positive input stage of the current switch, a first terminal of the current source and a positive output stage of the current switch;

wherein, in the second NMOS transistor, a gate, a source and a drain are each connected to a negative input stage of the current switch, the first terminal of the current switch and a negative output stage of the current switch; and wherein a second terminal of the current source is connected to the ground.

7. The analog-digital converter according to claim 1 further comprising:

a third sample-and-hold unit that samples and outputs a number of outputs of the second folder; and a subranging amplifier that amplifies and outputs a number of outputs of the third sample-and-hold unit, wherein the comparator performs a comparison operation on the outputs of the subranging amplifier to find a digital output value.

8. The analog-digital converter according to claim 7, wherein the subranging amplifier includes a number of amplifiers that amplify and output a number of input signals, respectively; and an interpolator that interpolates and outputs the output signals of the amplifier.

9. The analog-digital converter according to claim 1, wherein at least one of the pre-amplifier, the first folder and the second folder further comprises an interpolator that interpolates and outputs the output signals.

10. An analog-digital converter comprising:

a first sample-and-hold unit that samples and outputs a number of analog input voltages;

a reference voltage generator that generates a number of reference voltages;

a pre-amplifier that amplifies and outputs a number of values subtracting each reference voltage from the outputs of the first sample-and-hold unit, and that eliminates an offset effect due to asymmetry of the amplifier;

a first folder that folds and outputs a number of outputs of the pre-amplifier;

a second sample-and-hold unit that samples and outputs a number of outputs of the first folder;

a second folder that folds and outputs a number of outputs of the second sample-and-hold unit; and a comparator that performs a comparison operation between the outputs of the pre-amplifier and the output values of the second folder, wherein at least one of the pre-amplifier, the first folder and the second folder further comprises an interpolator that interpolates and outputs the output signals.

11. The analog-digital converter according to claim 10, wherein the pre-amplifier has a number of pre-amplification circuits, each pre-amplification circuit including:

an amplifier that amplifies voltages of differential input stages to output the amplified to differential output stages;

an input unit that, during a first period, applies a common voltage to the differential input stages of the amplifier, and during a second period, applies to the differential input stages of the amplifier a voltage according to subtraction-operation between a sampled positive analog input voltage and a positive reference voltage, as well as a voltage according to subtraction-operation between a sampled negative analog input voltage and a negative reference voltage;

an output unit that, during the first period, stores an offset voltage caused by asymmetry of the amplifier, and during the second period, outputs a voltage subtracting the offset voltage stored during the first period from the differential output of the amplifier; and a reset unit that interconnects the differential output stages of the amplifier during a third period, wherein the first and second periods are alternatively repeated without overlapping area and the third period corresponds to a front part of the first period.

12. The analog-digital converter according to claim 10, wherein the preamplifier has a number of the pre-amplification circuits, each pre-amplification circuit including:

a first capacitor having a first terminal and a second terminal;

a second capacitor having a first terminal and a second terminal;

a third capacitor having a first terminal and a second terminal;

a fourth capacity having a first terminal and a second terminal;

a first switch that connects a sampled positive analog input voltage to the first terminal of the first capacitor only during a first period;

a second switch that connects a positive reference voltage to the first terminal of the first capacitor only during a second period;

a third switch that connects a negative reference voltage to the first terminal of the second capacitor only during the second period;

a fourth switch that connects a sampled negative analog input voltage to the first terminal of the second capacitor only during the first period;

a fifth switch that connects a common voltage to the second terminal of the first capacitor and the second terminal of the second capacitor only during the first period;

an amplifier in which differential input stages are connected to the second terminal of the first capacitor and the second terminal of the second capacitor, and differential output stages are connected to the first terminal of the third capacitor and the first terminal of the fourth capacitor;

a sixth switch that interconnects the differential output stages of the amplifier only during a third period; and a seventh switch that connects the common voltage to the second terminal of the third capacitor and the second terminal of the fourth capacitor only during the first period, wherein the first period and the second period are alternatively repeated without overlapping area, and the third period corresponds to a front part of the first period.

13. The analog-digital converter according to claim 12, wherein the amplifier includes a first NMOS transistor, a second NMOS transistor, a current source, a first load and a second load;

wherein, in the first NMOS transistor, a gate, a source and a drain are each connected to a positive input stage of the amplifier, a first terminal of the current source and a positive output stage of the amplifier;

wherein, in the second NMOS transistor, a gate, a source and a drain are each connected to a negative input stage of the amplifier, the first terminal of the current source and a negative output stage of the amplifier;

wherein, a second terminal of the current source is connected to the ground;

wherein the first load is connected to the positive output stage of the amplifier and a voltage power supply; and wherein the second load is connected to the negative output stage of the amplifier and the voltage power supply.

14. The analog-digital converter according to claim 10, wherein the first and second folders include a number of folding circuits, each folding circuit having an odd number of current switches that each convert and output an odd number of differential input voltages into an odd number of differential currents, a first load, a second load and a switch, wherein output stages of the odd number of current switches are alternatively connected to the differential output stages of the folding circuit;

wherein the first load is connected to the positive output stage of the folding circuit and a voltage power supply;

wherein the second load is connected to the negative output stage of the folding circuit and the voltage power supply; and wherein the switch is connected to the positive output stage and the negative output stage of the folding circuit.

15. The analog-digital converter according to claim 14, wherein the current switch includes a first NMOS transistor, a second NMOS transistor and a current source, wherein, in the first NMOS transistor, a gate, a source and a drain are each connected to a positive input stage of the current switch, a first terminal of the current source and a positive output stage of the current switch;

wherein, in the second NMOS transistor, a gate, a source and a drain are each connected to a negative input stage of the current switch, the first terminal of the current switch and a negative output stage of the current switch; and wherein a second terminal of the current source is connected to the ground.

16. The analog-digital converter according to claim 10, further comprising:

a third sample-and-hold unit that samples and outputs a number of outputs of the second folder; and a subranging amplifier that amplifies and outputs a number of outputs of the third sample-and-hold unit, wherein the comparator performs a comparison operation on the outputs of the subranging amplifier to find a digital output value.

17. The analog-digital converter according to claim 16, wherein the subranging amplifier includes a number of amplifiers that amplify and output a number of input signals, respectively; and an interpolator that interpolates and outputs the output signals of the amplifier.

* * * * *

(12) EX PARTE REEXAMINATION CERTIFICATE (6303rd)
United States Patent
Lee et al.

(10) Number: US 6,950,051 C1
(45) Certificate Issued: Jul. 15, 2008

(54) ANALOG-DIGITAL CONVERTER WITH PIPELINE FOLDING SCHEME

(75) Inventors: Seung Chul Lee, Daejeon-Shi (KR); Min Hyung Cho, Daejeon-Shi (KR); Mun Yang Park, Daejeon-Shi (KR)

(73) Assignee: Electronics and Telecommunications Research Institute, Yuseong-Gu, Daejon-Shi (KR)

Reexamination Request:
No. 90/008,082, Jun. 30, 2006

Reexamination Certificate for:
Patent No.: 6,950,051
Issued: Sep. 27, 2005
Appl. No.: 10/872,530
Filed: Jun. 22, 2004

(51) Int. Cl.
*H03M 1/14* (2006.01)
*H03M 1/16* (2006.01)
*H03M 1/36* (2006.01)

(52) U.S. Cl. .......................................... 341/161; 341/156
(58) Field of Classification Search .................. None
See application file for complete search history.

(56) References Cited

U.S. PATENT DOCUMENTS 6,411,246 B2    6/2002   Nagaraj ..................... 341/161

FOREIGN PATENT DOCUMENTS

JP         2002-374168          12/2002

*Primary Examiner*—Fritz M Fleming (57) ABSTRACT

Provided is a pipelined folding analog-digital converter, the pipelined folding analog-digital converter comprising: a first sample-and-hold unit that samples and outputs a number of analog input voltages; a reference voltage generator that generates a number of reference voltages; a pre-amplifier that amplifies and outputs a number of values subtracting each reference voltage from the outputs of the first sample-and-hold unit, wherein an offset effect due to asymmetry of the amplifier is eliminated; a first folder that folds and outputs a number of outputs of the pre-amplifier; a second sample-and-hold unit that samples and outputs a number of outputs of the first folder; a second folder that folds and outputs a number of outputs of the second sample-and-hold unit; and a comparator that performs a comparison operation between the outputs of the pre-amplifier and the output values of the second folder to find a digital output value, whereby the offset caused by the device mismatch is removed, so that it is possible to realize a high-resolution analog-digital converter.

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claim 1 is confirmed.

Claims 2–17 were not reexamined.

* * * * *